(12) United States Patent
Holt et al.

(10) Patent No.: US 10,020,307 B1
(45) Date of Patent: Jul. 10, 2018

(54) INTEGRATED CIRCUIT STRUCTURE INCLUDING LATERALLY RECESSED SOURCE/DRAIN EPITAXIAL REGION AND METHOD OF FORMING SAME

(71) Applicant: GLOBALFOUNDRIES INC., Grand Cayman (KY)

(72) Inventors: Judson R. Holt, Ballston Lake, NY (US); Christopher D. Sheraw, Ballston Spa, NY (US); Timothy J. McArdle, Ballston Lake, NY (US); Matthew W. Stoker, Ballston Lake, NY (US); Mira Park, Clifton Park, NY (US); George R. Mulfinger, Gansevoort, NY (US); Yinxiao Yang, Troy, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/429,502

(22) Filed: Feb. 10, 2017

(51) Int. Cl.
| | | |
|---|---|---|
| *H01L 21/8249* | (2006.01) | |
| *H01L 27/092* | (2006.01) | |
| *H01L 21/8234* | (2006.01) | |

(52) U.S. Cl.
CPC .. *H01L 27/0924* (2013.01); *H01L 21/823418* (2013.01); *H01L 21/823431* (2013.01); *H01L 21/823468* (2013.01); *H01L 21/823481* (2013.01)

(58) Field of Classification Search
CPC ......... H01L 27/0924; H01L 21/823481; H01L 21/823468; H01L 21/823418; H01L 21/823431
See application file for complete search history.

(56) References Cited

U.S. PATENT DOCUMENTS

2017/0222014 A1\* 8/2017 Tak ..................... H01L 29/4916

\* cited by examiner

*Primary Examiner* — Cuong B Nguyen
(74) *Attorney, Agent, or Firm* — Francois Pagette; Hoffman Warnick LLC

(57) ABSTRACT

The disclosure is directed to an integrated circuit structure and a method of forming the same. The integrated circuit structure may include: a first device region laterally adjacent to a second device region over a substrate, the first device region including a first fin and the second device region including a second fin; a first source/drain epitaxial region substantially surrounding at least a portion of the first fin; a spacer substantially surrounding the first source/drain epitaxial region, the spacer including an opening in a lateral end portion of the spacer such that the lateral end portion of the spacer overhangs a lateral end portion of the first source/drain epitaxial region; and a liner lining the lateral end portion of the first source/drain epitaxial region beneath the overhanging lateral end portion of the spacer.

11 Claims, 4 Drawing Sheets

INTEGRATED CIRCUIT STRUCTURE INCLUDING LATERALLY RECESSED SOURCE/DRAIN EPITAXIAL REGION AND METHOD OF FORMING SAME

BACKGROUND

Technical Field

The present disclosure relates to integrated circuit structures, and more particularly to an integrated circuit structure including a laterally recessed source/drain epitaxial region and method of forming the same.

Related Art

In modern integrated circuits, such as microprocessors, storage devices and the like, a very large number of circuit elements, especially transistors, are provided and operated on a restricted chip area. In integrated circuits fabricated using metal-oxide-semiconductor (MOS) technology, field effect transistors (FETs) (with both n-type MOS (NMOS) and p-type MOS (PMOS) transistors) are provided that are typically operated in a switching mode. That is, these transistor devices exhibit a highly conductive state (on-state) and a high impedance state (off-state). FETs may take a variety of forms and configurations. For example, among other configurations, FETs may be either so-called planar FET devices or three-dimensional (3D) devices, such as finFET devices.

A FET, irrespective of whether an NMOS transistor or a PMOS transistor is considered, and irrespective of whether it is a planar or 3D device, typically comprises doped source/drain regions that are formed in or on a semiconductor substrate that are separated by a channel region. In a 3D device, the source/drain regions may be formed by epitaxially growing a semiconductor material from the substrate or the fins such that the epitaxially grown semiconductor material surrounds the fins. A gate insulation layer is positioned above the channel region and a conductive gate electrode is positioned above the gate insulation layer. The gate insulation layer and the gate electrode together may sometimes be referred to as the gate stack structure for the device. By applying an appropriate voltage to the gate electrode, the channel region becomes conductive and current is allowed to flow from the source region to the drain region. In a planar FET device, the gate stack is formed above a substantially planar upper surface of the substrate. In a 3D device, the gate stack substantially surrounds a fin.

As integrated circuits continue to scale down, e.g., 7 nanometer and beyond, space on the integrated circuit becomes more valuable and small changes in sizing of structures can greatly impact device performance. Large source/drain epitaxial regions can increase device performance. However, as integrated circuits continue to scale down, it is difficult to form a large source/drain epitaxial region on one device without merging the source/drain epitaxial region with another source/drain epitaxial region on a laterally adjacent device.

SUMMARY

A first aspect of the disclosure is directed to a method for forming an integrated circuit structure. The method may include: forming a first fin over a substrate within a first device region; forming a first source/drain epitaxial region over the first fin in the first device region; forming a spacer surrounding the first source/drain epitaxial region; removing a lateral end portion of the spacer from over the first source/drain epitaxial region to expose a lateral end portion of the first source/drain epitaxial region over the first fin; removing the exposed lateral end portion of the first source/drain epitaxial region such that the first source/drain epitaxial region is laterally recessed with respect to a remaining lateral end portion of the spacer; and forming a liner over the spacer and in contact with the laterally recessed first source/drain epitaxial region.

A second aspect of the disclosure is directed to an integrated circuit structure. The integrated circuit structure may include: a first device region laterally adjacent to a second device region over a substrate, the first device region including a first fin and the second device region including a second fin; a first source/drain epitaxial region substantially surrounding at least a portion of the first fin; a spacer substantially surrounding the first source/drain epitaxial region, the spacer including an opening in a lateral end portion of the spacer such that the lateral end portion of the spacer overhangs a lateral end portion of the first source/drain epitaxial region; and a liner lining the lateral end portion of the first source/drain epitaxial region beneath the overhanging lateral end portion of the spacer.

A third aspect of the disclosure is directed to an integrated circuit structure. The integrated circuit structure may include: a first device region laterally adjacent to a second device region over a substrate, the first device region including a first fin and the second device region including a second fin; a first source/drain epitaxial region substantially surrounding at least a portion of the first fin; a spacer substantially surrounding the first source/drain epitaxial region, the spacer including an opening in a lateral end portion of the spacer such that the lateral end portion of the spacer overhangs a lateral end portion of the first source/drain epitaxial region; a liner lining the lateral end portion of the first source/drain epitaxial region beneath the overhanging lateral end portion of the spacer; and a second source/drain epitaxial region substantially surrounding the second fin and isolated from the first source/drain epitaxial region, wherein the second source/drain epitaxial region is isolated from the first source/drain epitaxial region.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein:

FIG. 7 shows a resulting integrated circuit structure according to embodiments of the disclosure.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

The present disclosure relates to integrated circuit structures, and more particularly to an integrated circuit structure including a laterally recessed source/drain epitaxial region and method of forming the same. The laterally recessed source/drain region may be substantially surrounded by a spacer and a liner. By laterally recessing the source/drain region on one device, the source/drain epitaxial region on another laterally adjacent device can be grown to be larger without merging the source/drain epitaxial regions of the two devices.

Figure 1:
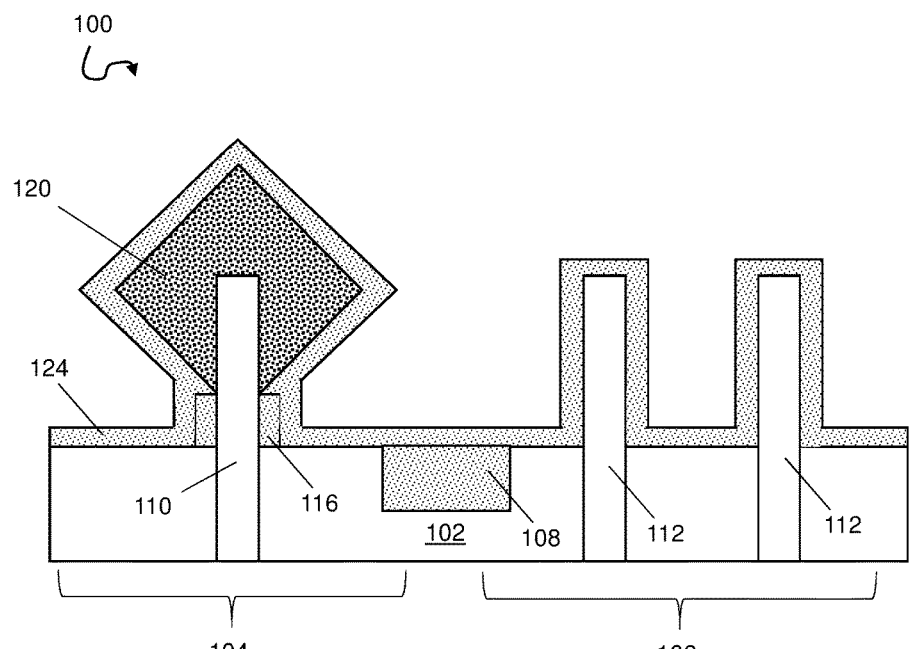
FIGS. 1-7 show cross-sectional views of an integrated circuit structure undergoing aspects of a method according to embodiments of the disclosure, where

FIG. 1 shows a cross-sectional view of a preliminary integrated circuit (IC) structure 100 according to embodiments of the disclosure. IC structure 100 may include a substrate 102. Substrate 102 may include but is not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entirety of substrate 102 may be strained. While substrate 102 is shown as including a single layer of semiconductor material, it is emphasized that the teachings of the disclosure are equally applicable to semiconductor-on-insulator (SOI) substrates. As known in the art, SOI substrates may include a semiconductor layer on an insulator layer on another semiconductor layer (not shown). The semiconductor layers of an SOI substrate may include any of the semiconductor substrate materials discussed herein. The insulator layer of the SOI substrate may include any now known or later developed SOI substrate insulator such as but not limited to silicon oxide.

Substrate 102 may include a device region 104 laterally adjacent to another device region 106 included, e.g., within the same substrate 102. As will be described herein, device regions 104, 106 may each include a p-type field effect transistor (pFET) and/or an n-type field effect transistor (nFET). As shown in FIG. 1, device region 104 may include at least one fin 110 (one shown) and device region 106 may include at least one fin 112 (two shown). That is, fins 110 may be formed in device region 104 and fins 112 may be formed in device region 106. Any number of fins 110, 112 may be included in device regions 104, 106, respectively, without departing from aspects of the disclosure. Fins 110, 112 may be patterned and etched from substrate 102, e.g., with a mask (not shown) in place, e.g., in a preceding step. A shallow trench isolation (STI) 108 may be formed within substrate 102 to electrically isolate device regions 104, 106 from each other. STI 108 may be formed by conventional lithography techniques and may include any now known or later developed STI material, such as for example, an oxide or a nitride. While the present disclosure is shown and described with respect to a fin-type field effect transistor (finFET), it is to be understood that aspects of the disclosure are equally applicable to other FETs, e.g., a planar FET, having source/drain epitaxial regions.

As used herein, "etching" generally refers to the removal of material from a substrate or structures formed on the substrate by wet or dry chemical means. In some instances, it may be desirable to selectively remove material from certain areas of the substrate. In such an instance, a mask may be used to prevent the removal of material from certain areas of the substrate. There are generally two categories of etching, (i) wet etch and (ii) dry etch. Wet etching may be used to selectively dissolve a given material and leave another material relatively intact. Wet etching is typically performed with a solvent, such as an acid. Dry etching may be performed using a plasma which may produce energetic free radicals, or species neutrally charged, that react or impinge at the surface of the wafer. Neutral particles may attack the wafer from all angles, and thus, this process is isotropic. Ion milling, or sputter etching, bombards the wafer with energetic ions of noble gases from a single direction, and thus, this process is highly anisotropic. A reactive-ion etch (RIE) operates under conditions intermediate between sputter etching and plasma etching and may be used to produce deep, narrow features, such as trenches.

A pair of spacers 116 may be formed on opposing sides of each fin 110 in device region 104. Spacers 116 may be formed by depositing any now known or later developed spacer material such as for example, an oxide, e.g., silicon oxide, or a nitride, e.g., silicon nitride, over substrate 102 and surrounding fins 110. A mask (not shown) may be formed over device region 106 to prevent the depositing of the spacer material in device region 106. The spacer material may be etched such that only a portion of the spacer material remains on opposing sides of fin 110. Further, the spacer material may be recessed such that a height of the spacer material is less than a height of fin 110 in order to form pair of spacers 116.

"Depositing" or "deposition" as used herein, may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Still referring to FIG. 1, a source/drain epitaxial region 120 may be formed over and surrounding fin 110 in device region 104 and over spacers 116. Source/drain epitaxial region 120 may include any now known or later developed semiconductor material such as for example, any of the semiconductor materials discussed relative to substrate 102, e.g., silicon germanium. The material selected for source/drain epitaxial region 120 may be chosen based on whether a pFET or an nFET is to be fabricated in device region 104. In a pFET, source/drain epitaxial region 120 may include silicon germanium doped with any p-type dopant, e.g., boron, as known in the art. In an nFET, source/drain epitaxial region 120 may include a carbon doped silicon material doped with any known n-type dopant, e.g., phosphorus or arsenic, as known in the art.

Source/drain epitaxial region 120 may be formed by epitaxial growth of the source/drain epitaxial material. The terms "epitaxial growth and/or deposition" and "epitaxially formed and/or grown" mean the growth of a semiconductor material on a deposition surface of a semiconductor material, in which the semiconductor material being grown may have the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth and/or deposition processes may be selective to forming on semiconductor surfaces, and may not deposit material on dielectric surfaces, such as silicon dioxide or silicon nitride surfaces.

After source/drain epitaxial region 120 is formed, a spacer 124 may be formed such that spacer 124 substantially surrounds source/drain epitaxial region 120. That is, spacer 124 may be formed around source/drain epitaxial region 120. As used herein, "substantially" refers to largely, for the most part, entirely specified or any slight deviation which provides the same technical benefits of the disclosure. Additionally, spacer 124 may be formed such that spacer 124 overlies portions of substrate 102 and fins 112 in device region 106. Spacer 124 may be formed by conformal deposition of a spacer material, such as for example, an oxide, e.g., silicon oxide, or a nitride, e.g., silicon nitride.

Figure 2:
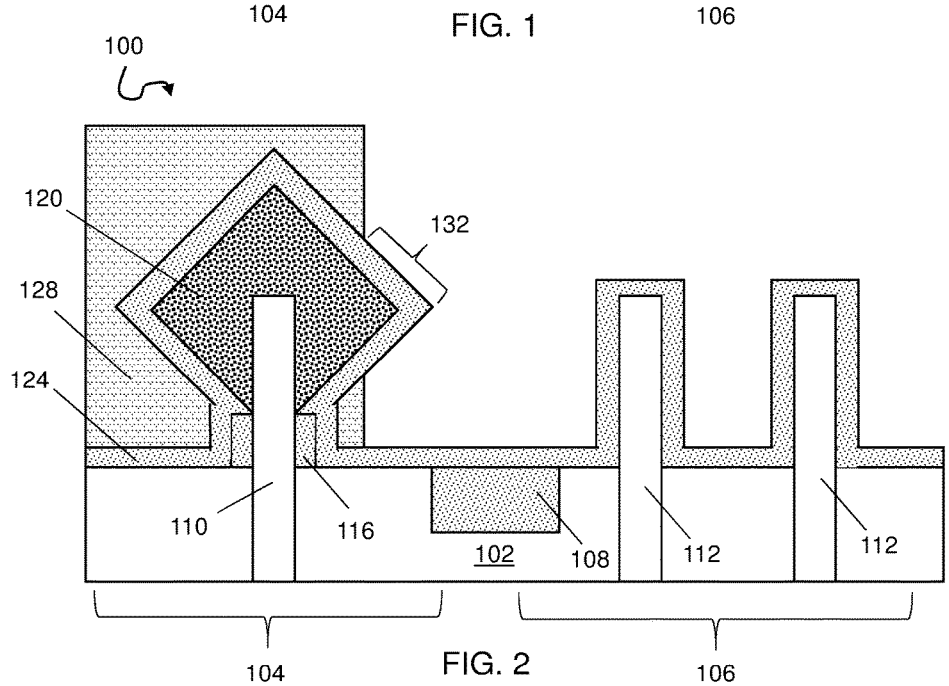

Turning now to FIG. 2, a mask 128 may be formed, e.g., via deposition, and patterned such that mask 128 remains over a substantial portion of device region 104 including a substantial portion of source/drain epitaxial region 120 and spacer 124 thereover. Mask 128 may be patterned such that device region 106 and a lateral end portion 132 of spacer 124 nearest device region 106 remain exposed. The amount of spacer 124 that remains exposed by mask 128 can be chosen based on the amount that source/drain epitaxial region 120 is to be laterally recessed.

Figure 3:
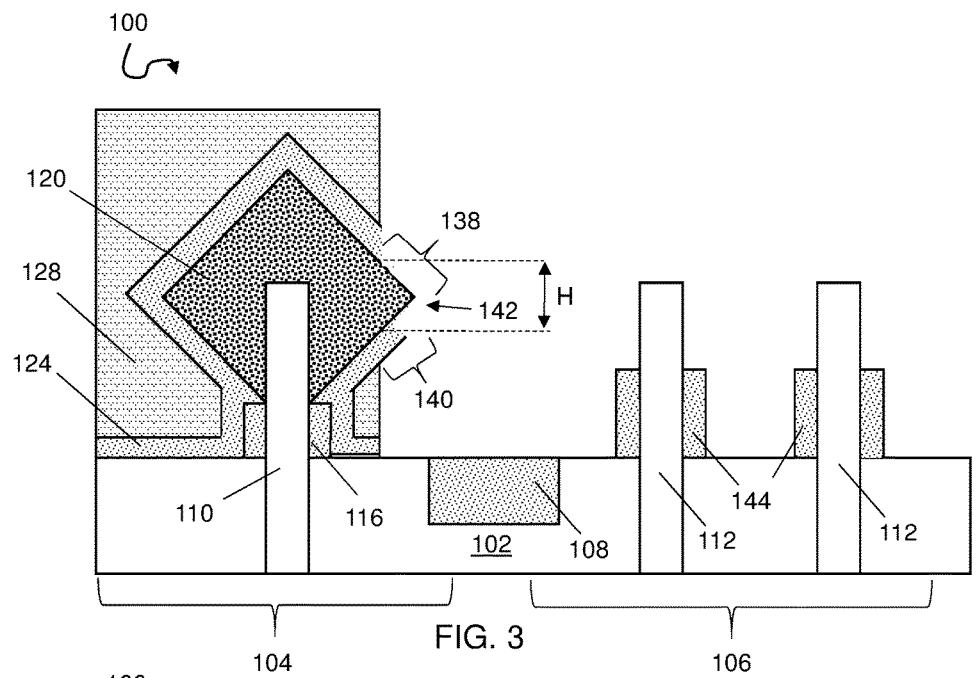

As shown in FIG. 3, exposed lateral end portion 132 (FIG. 2) of spacer 124 may be removed, e.g., via etching (such as with an anisotropic etch), from over source/drain epitaxial region 120 to expose a lateral end portion 138 of source/drain epitaxial region 120 over fin 110 nearest device region 106 thereunder. As shown in FIG. 3, a portion 140 of lateral end portion 132 (FIG. 2) of spacer 124 may remain beneath lateral end portion 138 of source/drain epitaxial region 120 as portion 140 may be at least partially shielded from the etching by lateral end portion 138 of source drain epitaxial region 120. As a result, lateral end portion 140, with any remaining spacer 124 above source/drain epitaxial region 120, may define an opening 142 which exposes lateral end portion 138 of source/drain epitaxial region 120. Opening 142 may include a height H of approximately 1 nanometer (nm) to approximately 50 nm, depending on the desired epitaxy size, lithography overlay tolerance, and other technology dimensions. As used herein "approximately" is intended to include values, for example, within 10% of the stated values. Additionally, the etching of spacer 124 may result in the removal of spacer 124 that is over substrate 102 in areas not covered by mask 128, e.g., device region 106, such that a portion of spacer 124 over substrate 102 in device region 104 that is covered by mask 128 remains. Further, the etching of spacer 124 may result in pair of spacers 144 being formed on opposing sides of fins 112 in device region 106.

Figure 4:
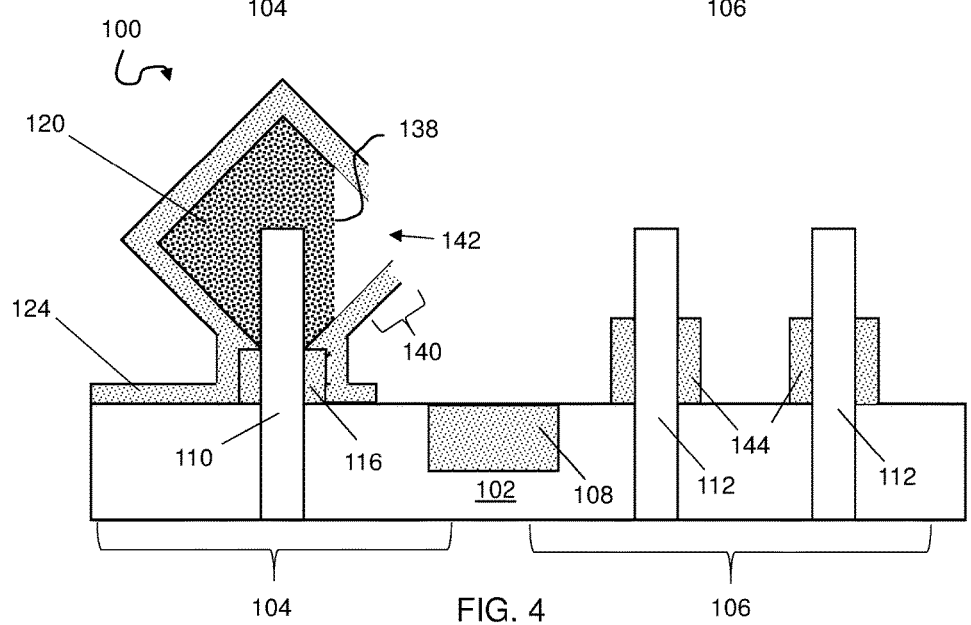

Turning now to FIG. 4, mask 128 (FIG. 3) may be removed, e.g., via etching. Further, the exposed lateral end portion 138 of source/drain epitaxial region 120 may be removed such that source/drain epitaxial region 120 is laterally recessed with respect to a remaining lateral end portion 140 of the spacer 124. Lateral end portion 138 of source/drain epitaxial region 120 may be laterally recessed via at least one of: RIE, a hydrogen chloride etch within an epitaxial chamber, or with hot Huang-A etching. However, it is to be understood that any now known or later developed etch process for source/drain epitaxial region 120 that is selective to fin 110 can be used without departing from aspects of the disclosure. As shown in FIG. 4, the lateral recessing of source/drain epitaxial region 120 may reduce a lateral width, i.e., horizontal width of the cross-section, of source/drain epitaxial region 120 and laterally expand opening 142 such that a remaining portion 140 of spacer 124 over source/drain epitaxial region 120 overhangs the recessed lateral end portion 138 of source/drain epitaxial region 120. That is, at this point in the process, opening 142 may be defined by remaining portions of spacer 124, e.g., remaining lateral end portion 140, and recessed lateral end portion 138 as shown in FIG. 4.

Figure 5:
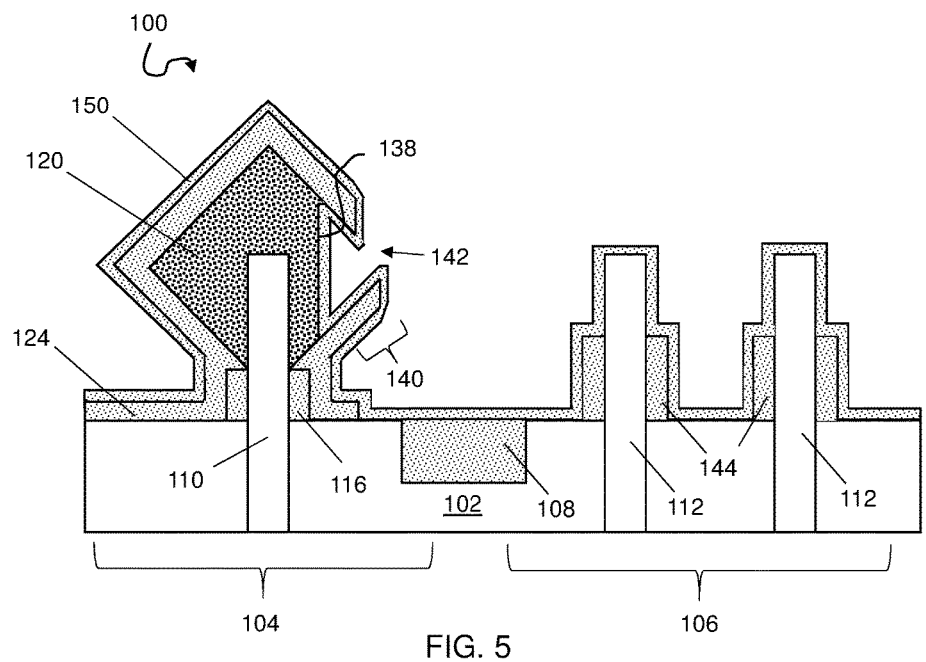

As shown in FIG. 5, a liner 150 may be formed, e.g., conformally deposited, over IC structure 100. Liner 150 may be formed over spacer 124 and in contact with the laterally recessed lateral end portion 138 of first source/drain epitaxial region 120 within opening 142. That is, liner 150 may substantially line recessed source/drain epitaxial region 120 within opening 142. Liner 150 may be formed over substrate 102, any remaining spacer 124 that is over substrate 102 and surrounding source/drain epitaxial region 120, and over fins 112 in device region 106. Liner 150 may include any now known or later developed liner material such as for example, an oxide, e.g., silicon oxide, or a nitride, e.g., silicon nitride.

Figure 6:
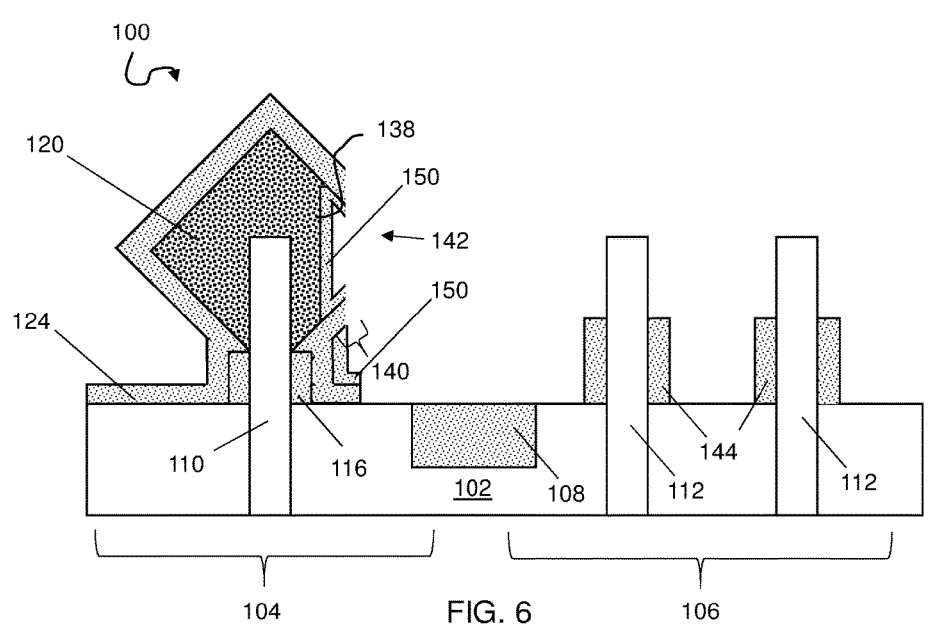

Turning now to FIG. 6, remaining lateral end portion 140 of spacer 124 may be laterally recessed, e.g., by anisotropic etching or semi-anisotropic etching, such that a size of the overhang of remaining lateral end portion 140 over the recessed lateral end portion 138 of source/drain epitaxial region 120 is reduced. The etching may also remove liner 150 that is over substrate 102, spacers 144, fins 112, and surrounds source/drain epitaxial region 120. Further, a portion of spacer 124 may be inadvertently removed or recessed during the etching line 150. However, liner 150 within opening 142 remains. More specifically, a portion of liner 150 lines or remains in contact with lateral end 138 within opening 142. Further, portions of liner 150 line a surface of spacer 124 that defines opening 142. That is, portions of liner 150 which are shielded by spacer 124 remain on IC structure 100. While not shown, portions of liner 150 which are shielded by spacer 124 on an opposing side of fin 110 that opening 142 is on may also remain depending on etching rates and techniques.

Figure 7:
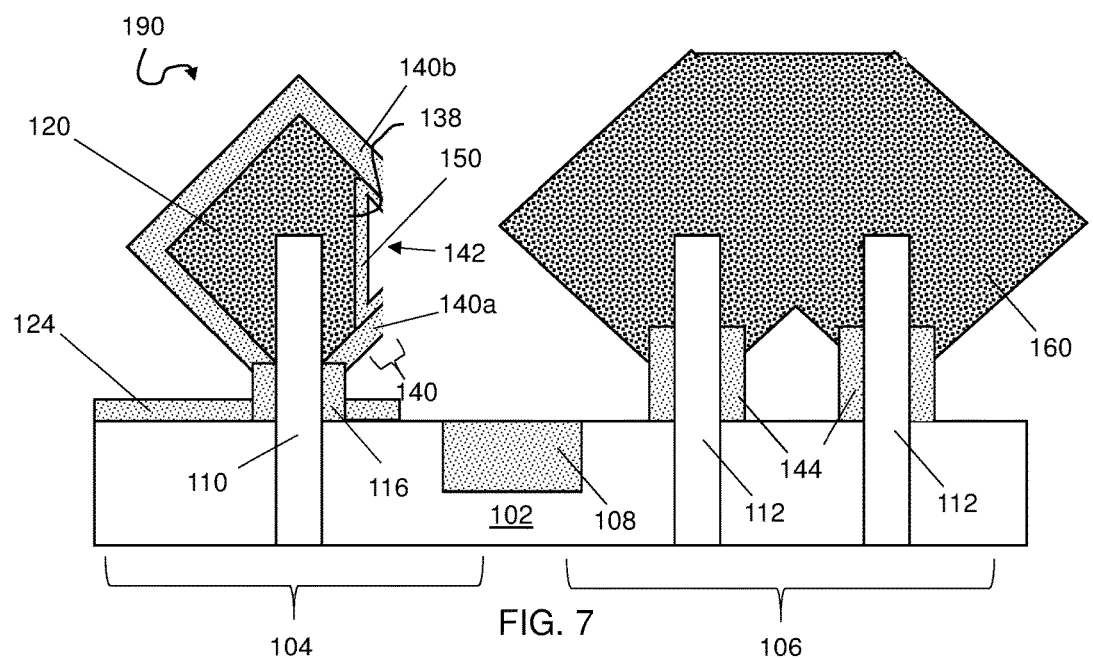

Turning now to FIG. 7, another source/drain epitaxial region 160 may be formed, e.g., by epitaxial growth, over fins 112 in device region 106. Source/drain epitaxial region 160 may include any now known or later developed semiconductor material such as for example, any of the semiconductor materials, e.g., silicon germanium, discussed relative to substrate 102. The material selected for source/drain epitaxial region 120 may be chosen based on whether a pFET or an nFET is to be fabricated in device region 104. For example, in a pFET, source/drain epitaxial region 120 may include silicon germanium doped with any p-type dopant, e.g., boron, as known in the art. In an nFET, source/drain epitaxial region 120 may include a carbon doped silicon material doped with any known n-type dopant, e.g., phosphorus or arsenic, as known in the art. As shown in FIG. 7, source/drain epitaxial region 160 may be grown to a much larger size than conventional IC structures because source/drain epitaxial region 160 does not merge with source/drain epitaxial region 120 due to the reduced lateral width of source/drain epitaxial region 120. Therefore, source/drain epitaxial region 160 is structurally and electrically isolated from source/drain epitaxial region 120. For example, in a 14 nm device, conventional widths of source/drain epitaxial regions may be approximately 50 nm. The present disclosure provides for IC structures having a width of greater than 50 nm and even up to approximately 70 nm. In another example, in a 7 nm device, conventional widths of source/drain epitaxial regions may be approximately 30 nm. The present disclosure provides for IC structures having a width of greater than 30 nm and even up to approximately 50 nm. In an even further example, in a 5 nm device, conventional widths of source/drain epitaxial regions may be approximately 20 nm. The present disclosure provides for IC structures having a width of greater than 20 nm and even up to approximately 35 nm.

FIG. 7 shows a resulting IC structure 190 after source/drain epitaxial region 160 is grown. IC structure 190 may include device 104 region laterally adjacent to device region 106 over substrate 102. Device region 104 may include fin 110 over substrate 102 and device region 106 may include fin 112 over substrate 102. Source/drain epitaxial region 120 may substantially surround at least a portion of fin 110 within device region 104. Source/drain epitaxial region 160 may substantially surround at least a portion of second fin 112 within device region 106. Spacer 124 may substantially surround source/drain epitaxial region 120. Spacer 124 may include opening 142 in lateral end portion 140 of spacer 124 such that lateral end portion 140 of the spacer 124 overhangs lateral end portion 138 of source/drain epitaxial region 120. Liner 150 may line lateral end portion 138 of source/drain epitaxial region 120 beneath the overhanging lateral end portion 140 of spacer 124. Source/drain epitaxial region 160 may be isolated from source/drain epitaxial region 120. Opening 142 may include a height of approximately 1 nm to approximately 50 nm. The height may be measured from a bottom portion 140a of lateral end portion 140 of spacer 124 to an upper portion 140b of lateral end portion 140 of spacer 124. IC structure 190 may also include STI 108 separating and isolating device region 104 and device region 106. In one embodiment, device region 104 includes a pFET and device region 106 includes an nFET. In another embodiment, device region 104 includes an nFET and device region 106 includes a pFET. It should be understood that this invention can apply equally to source/drain epitaxial regions grown around an existing fin, e.g., fins 110, 112 (also known as "cladded" epitaxy) as well as a device with a recessed fin (also known as "embedded" epitaxy). In an embodiment including a recessed fin (not shown), fins 110, 112 may be recessed prior to the formation of source/drain epitaxial regions 120, 160.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately" and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s). "Substantially" refers to largely, for the most part, entirely specified or any slight deviation which provides the same technical benefits of the invention.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method for forming an integrated circuit structure, the method comprising:
   forming a first fin over a substrate within a first device region;
   forming a first source/drain epitaxial region over the first fin in the first device region;
   forming a spacer surrounding the first source/drain epitaxial region;
   removing a lateral end portion of the spacer from over the first source/drain epitaxial region to expose a lateral end portion of the first source/drain epitaxial region over the first fin;
   removing the exposed lateral end portion of the first source/drain epitaxial region such that the first source/ drain epitaxial region is laterally recessed with respect to a remaining lateral end portion of the spacer; and forming an electrically insulating liner over the spacer and in contact with the laterally recessed first source/drain epitaxial region.

2. The method of claim 1, further comprising:
recessing the remaining lateral end portion of the spacer.

3. The method of claim 1, further comprising:
forming a second device region having a second fin over the substrate, the second device region being laterally adjacent to the first device region; and forming a second source/drain epitaxial region over the second fin in the second device region.

4. The method of claim 3, wherein the second source/drain epitaxial region is isolated from the first source/drain epitaxial region.

5. The method of claim 3, further comprising:
recessing the remaining lateral end portion of the spacer; and after the recessing the remaining lateral end portion of the spacer and before the forming of the second source/drain epitaxial region, patterning a mask to cover the first device region and expose the second device region.

6. The method of claim 1, further comprising:
after the forming of the spacer and before the removing the lateral end portion of the spacer, patterning a first mask over the first device region such that the first mask exposes the lateral end portion of the spacer; and after the removing of the exposed lateral end portion of the first source/drain epitaxial region and before the forming of the liner over the spacer, removing the first mask.

7. The method of claim 1, wherein the removing the lateral end portion of the first source/drain epitaxial region reduces a lateral width of the first source/drain epitaxial region.

8. The method of claim 1, wherein the removing of the lateral end portion of the first source/drain epitaxial region defines an overhang in the remaining lateral end portion of the spacer.

9. The method of claim 8, wherein the recessing the remaining lateral end portion of the spacer includes reducing a size of the overhang of the remaining lateral end portion of the spacer.

10. The method of claim 1, wherein the first device region includes a p-type field effect transistor (pFET) and the second device region includes an n-type field effect transistor (nFET).

11. The method of claim 1, wherein the first device region includes an n-type field effect transistor (nFET) and the second device region includes a p-type field effect transistor (pFET).

* * * * *